(12) United States Patent
Akatsu et al.

(10) Patent No.: US 7,449,394 B2
(45) Date of Patent: Nov. 11, 2008

(54) ATOMIC IMPLANTATION AND THERMAL TREATMENT OF A SEMICONDUCTOR LAYER

(75) Inventors: Takeshi Akatsu, St. Nazaire les Eymes (FR); Nicolas Daval, Grenoble (FR); Nguyet-Phuong Nguyen, Grenoble (FR); Olivier Rayssac, Grenoble (FR); Konstantin Bourdelle, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 366 days.

(21) Appl. No.: 11/179,713

(22) Filed: Jul. 11, 2005

(65) Prior Publication Data

US 2005/0245049 A1    Nov. 3, 2005

Related U.S. Application Data

(63) Continuation of application No. PCT/FR2005/000542, filed on Mar. 7, 2005, and a continuation-in-part of application No. 11/059,122, filed on Feb. 16, 2005, now Pat. No. 7,276,428.

(30) Foreign Application Priority Data

Mar. 5, 2004  (FR)  .................................. 04 02340
Sep. 21, 2004 (FR)  .................................. 04 09980

(51) Int. Cl.
*H01L 21/46*   (2006.01)

(52) U.S. Cl. .......................... 438/458; 438/455; 438/528

(58) Field of Classification Search .................. 438/458, 438/455, 459, 479, 527, 528
See application file for complete search history.

(56) References Cited

U.S. PATENT DOCUMENTS 4,462,847 A     7/1984   Thompson et al.  .......... 148/174

(Continued)

FOREIGN PATENT DOCUMENTS

EP         0 961 312           5/1999

(Continued)

OTHER PUBLICATIONS

Schaffler, Friedrich, 1997, "High Mobility Si and Ge Structures", Semicond. Sci. Technol., 12, pp. 1515-1549.

(Continued)

*Primary Examiner*—Michael Trinh
(74) *Attorney, Agent, or Firm*—Winston & Strawn LLP

(57) ABSTRACT

Methods for forming a semiconductor structure are described. In an embodiment, the technique includes providing a donor wafer having a first semiconductor layer and a second semiconductor layer on the first layer and having a free surface; coimplanting two different atomic species through the free surface of the second layer to form a zone of weakness zone in the first layer; bonding the free surface of the second layer to a host wafer; and supplying energy to detach at the zone of weakness a semiconductor structure comprising the host wafer, the second layer and a portion of the first layer. Advantageously, the donor wafer includes a SiGe layer, and the co-implantation of atomic species is conducted according to implantation parameters adapted to enable a first species to form the zone of weakness in the SiGe layer, and to enable a second species to provide a concentration peak located beneath the zone of weakness in the donor wafer to thus minimize surface roughness resulting from detachment at the zone of weakness.

19 Claims, 9 Drawing Sheets

U.S. PATENT DOCUMENTS

| | | | | |
|---|---|---|---|---|
| 4,604,304 | A | 8/1986 | Faraone et al. | 427/255 |
| 4,722,912 | A | 2/1988 | Flatley et al. | 437/180 |
| 5,374,564 | A | 12/1994 | Bruel | 438/455 |
| 5,882,987 | A | 3/1999 | Srikrishnan | 438/458 |
| 6,245,161 | B1 | 6/2001 | Henley et al. | 148/33.4 |
| 6,352,942 | B1 | 3/2002 | Luan et al. | 438/770 |
| 6,448,152 | B1 | 9/2002 | Henley et al. | 438/458 |
| 6,562,703 | B1 | 5/2003 | Maa et al. | 438/518 |
| 6,603,156 | B2 | 8/2003 | Rim | 257/190 |
| 6,613,678 | B1 | 9/2003 | Sakaguchi et al. | 438/695 |
| 6,649,492 | B2 | 11/2003 | Chu et al. | 438/478 |
| 6,717,213 | B2 | 4/2004 | Doyle et al. | 257/347 |
| 6,756,286 | B1 | 6/2004 | Moriceau et al. | 438/459 |
| 6,995,430 | B2 | 2/2006 | Langdo et al. | 257/352 |
| 7,001,826 | B2 * | 2/2006 | Akatsu et al. | 438/458 |
| 7,067,386 | B2 | 6/2006 | Doyle et al. | 438/407 |
| 2002/0072130 | A1 | 6/2002 | Cheng et al. | 438/10 |
| 2002/0140031 | A1 | 10/2002 | Rim | 257/347 |
| 2002/0185686 | A1 | 12/2002 | Christiansen | 438/10 |
| 2003/0003679 | A1 | 1/2003 | Doyle et al. | 438/406 |
| 2003/0124815 | A1 | 7/2003 | Henley et al. | 438/460 |
| 2003/0153161 | A1 | 8/2003 | Chu et al. | 438/455 |
| 2003/0203600 | A1 | 10/2003 | Chu et al. | 438/479 |
| 2003/0227057 | A1 | 12/2003 | Lochtefeld et al. | 257/347 |
| 2004/0005740 | A1 | 1/2004 | Lochtefeld et al. | 438/149 |
| 2004/0031929 | A9 | 2/2004 | Ahlers et al. | 250/458.1 |
| 2004/0031979 | A1 | 2/2004 | Lochtefeld et al. | 257/233 |
| 2004/0053477 | A1 | 3/2004 | Ghyselen et al. | 438/465 |
| 2004/0067622 | A1 | 4/2004 | Akatsu et al. | 438/459 |
| 2004/0137698 | A1 | 7/2004 | Taraschi et al. | 438/458 |
| 2004/0157402 | A1 | 8/2004 | Doyle et al. | 438/406 |
| 2004/0157409 | A1 | 8/2004 | Ghyselen et al. | 438/458 |
| 2004/0173790 | A1 | 9/2004 | Yeo et al. | 257/19 |
| 2004/0214434 | A1 | 10/2004 | Atwater et al. | 438/689 |
| 2005/0148163 | A1 * | 7/2005 | Nguyen et al. | 438/514 |
| 2005/0156246 | A1 | 7/2005 | Lochtefeld et al. | 257/347 |
| 2005/0189563 | A1 | 9/2005 | Lochtefeld et al. | 257/192 |
| 2005/0199954 | A1 | 9/2005 | Lochtefeld et al. | 257/347 |
| 2005/0205934 | A1 | 9/2005 | Lochtefeld et al. | 257/347 |
| 2005/0212061 | A1 | 9/2005 | Langdo et al. | 257/397 |
| 2005/0218453 | A1 | 10/2005 | Langdo et al. | 257/352 |
| 2005/0280103 | A1 | 12/2005 | Langdo et al. | 257/401 |
| 2006/0011984 | A1 | 1/2006 | Currie | 257/352 |
| 2006/0014363 | A1 | 1/2006 | Daval et al. | 438/455 |
| 2006/0014366 | A1 | 1/2006 | Currie | 438/517 |

FOREIGN PATENT DOCUMENTS

| | | |
|---|---|---|
| EP | 0 971 395 A1 | 1/2000 |
| EP | 1 359 615 A1 | 11/2003 |
| FR | 2 842 350 | 1/2001 |
| FR | 2 842 349 | 1/2004 |
| JP | 06318588 | 11/1994 |
| WO | WO 99/35674 | 7/1999 |
| WO | WO 03/105189 A2 | 12/2003 |
| WO | WO 2004/009861 A2 | 1/2004 |
| WO | WO 2004/027858 A1 | 4/2004 |

OTHER PUBLICATIONS

Tong, Q.Y., et al., 1999, "Semiconductor Wafer Bonding Science & Technology", Wiley Interscience Publication, pp. 1-15, 81-99.

Colinge, J. P., 1997, "Silicon-On-Insulator Technology", Materials to VLSI, 2nd Edition, pp. 50-51.

Agarwal, Aditya et al., 1998, "Efficient Production to Silicon-on Insulator Films by Co-implantation of He)+) with H(+)", Applied Physics Letters, 72:9, pp. 1086-1088.

B. Hollander et al., "Strain Relaxation Of Pseudomorphic $Si_{1-x}Ge_x$/ Si(100) Heterostructures After Hydrogen Or Helium Ion Implantation For Virtual Substrate Fabrication", Nuclear Instruments and Methods in Physics Research B 175-177, pp. 357-367 (2001).

S. M. Sze, "Physics of Semiconductor Devices", John Wiley and Sons (NY), Inc. 2J Edition (2002), pp. 440-442.

S. Wolf et al., "Silicon processing for the VLSI era" vol. I—Process Technology, Lattice Press (USA), 2nd Edition (2000), pp. 188-207.

* cited by examiner

US 7,449,394 B2

ATOMIC IMPLANTATION AND THERMAL TREATMENT OF A SEMICONDUCTOR LAYER

CROSS-REFERENCE TO RELATED APPLICATIONS

This application is a continuation of International Application no. PCT/FR2005/000542 filed Mar. 7, 2005, and a continuation-in-part of application Ser. No. 11/059,122 filed Feb. 16, 2005, now U.S. Pat No. 7,276,428 the entire content of each of which is expressly incorporated herein by reference thereto.

FIELD OF THE INVENTION

The invention generally relates to methods for forming a semiconductor structure that includes transferring a layer from a donor wafer. An embodiment of the method includes implanting atomic species to form a zone of weakness in the donor wafer at a given depth, bonding the donor wafer to a host wafer, supplying energy to detach a transfer layer from the donor wafer at the weakness zone and treating the transferred layer.

BACKGROUND ART

A type of layer transfer process called SMART-CUT® is known to those skilled in the art. Details of the technique may be found in many published documents, and an example is the extract on pages 50 and 51 of "Silicon on Insulator Technology: Material to VLSI, second edition," by Jean-Pierre Colinge published by "Kluwer Academic Publishers".

Simple implantation (for example, using hydrogen) at a suitable implantation energy can be used to conduct the implanting step. Alternately, a co-implantation process (for example, using hydrogen and helium) with dosing of the implanting chemical types at a suitable implantation energy could be used. The bonding step typically takes place on the surface of the donor wafer that underwent implantation, which is bonded to a bonding layer made of dielectric material such as $SiO_2$. Bonding techniques typically used by those skilled in the art include initial bonding by molecular adhesion. The document "Semiconductor Wafer Bonding Science and Technology" (Q Y Tong and U. Gösele, Wiley Interscience Publication, Johnson Wiley and Sons, Inc.) can be used to obtain more information.

During the detachment step, energy is at least partially provided, typically in the form of heat. Therefore, the thermal budget (the combination of the temperature and the duration of the heat treatment) needs to be considered to determine the moment when the layer to be transferred will be detached. Thus, a semiconductor on insulator structure may be formed. For example, an SOI structure (when the detached layer is made of silicon), an SiGeOI structure (when the detached layer is made of germanium silicon), a sSOI structure (when the transferred layer is made of strained silicon), or a GeOI structure (when the detached layer is made of germanium).

After detachment, it has been frequently observed that the transfer layer may have quite a rough surface, as well a lower quality crystalline structure on its surface. This is due especially to the prior implantation and detachment steps. Referring to FIG. 1, a semiconductor on insulator structure 30 is shown diagrammatically (composed of a host wafer 20, an electrically isolating layer 5 and the detached layer 1), which has such a reduced crystalline quality in its semiconductor part (that is, in the detached layer 1). The detached layer 1 has a defective zone 1A that includes existing crystalline defects and detrimental surface roughness. When hydrogen is used during the implanting step, the defective zone 1A typically has a thickness of around 150 nm. Furthermore, the implantation step may cause a reduction in the crystalline quality in the transfer layer 1 Treating the detached transfer layer 1 is therefore necessary to remove the defective zone 1A, and to thus recuperate at least part of the sound zone 1B of the transfer layer 1. For example, mechanical polishing or chemical-mechanical polishing (CMP) could be used to eliminate the surface roughness, and/or a sacrificial oxidation process could be used on the defective zone 1A.

For example, a method is described in the published U.S. patent application Ser. No. 2004/0053477 in which a strained silicon layer is detached from a donor substrate including a SiGe buffer layer. The implanting step consists of making the implantation in the buffer layer, and the treatment step consists of removing the detached part from the buffer layer by means of surface polishing the SiGe, and then selective etching the SiGe with respect to the strained Si. Selectively etching permits the desired layer to be obtained that has a good quality surface finish, and without too high a risk of damaging it (which could be the case if only polishing were used). However, the use of chemical etching to treat the transfer layer may in certain cases lead to at least partial detachment problems of the bonding interface. In particular, a chemical etching treatment may cause de-lamination at the edge of the bonding layer, by attacking the edge where it touches a slice of the created structure. For example, a HF treatment could be used on an sSOI (strained Silicon on Insulator) structure comprising $SiO_2$, buried under the strained Si, or a $H_2O_2$:HF:HAc treatment could be used (where HAc is the abbreviation of acetic acid) on an sSi/SiGeOI structure (strained silicon on SiGe On Insulator), where the buried SiGe and $SiO_2$ layers are likely to be etched under the strained Si layer.

As an alternative process to overcome the aforementioned problem, the etching solution could be diluted considerably so that its action is easier to control. However, this does not provide a satisfactory solution to the problem because it does not totally resolve the de-lamination problem, and a diluted solution works more slowly. Moreover, chemical etching requires prior preparation of the surface to be etched, which typically means using mechanical polishing means. In fact, etching preparation is necessary to correct part of the major roughness which could subsequently lead to etching that is not sufficiently homogeneous and likely to create traversing defects or holes in the remaining layer. The successive use of polishing and chemical etching make the post-detachment finishing step (as well as the entire sampling method) long, complex and costly.

It also has been proposed to perform the implanting step by implanting several atomic species, typically by performing an implantation of helium and an implantation of hydrogen.

This type of implantation is hereafter designated by the term co-implantation. Performing co-implantaion indeed allows for the total dose of co-implanted species that is used to be lower than that required for implanting a single species. The total dose of co-implantation species thus typically represents only about ⅓ of the dose of single species implantation.

As a result of this decrease in total implanted dose, a decrease of the defective zone thickness is found and this in particular allows to reduce or to simplify the finishing treatments performed after detachment. Copending PCT application PCT/IB2004/003300 filed Sep. 21, 2004, which teaching also has been made available to the public online on the IP.com site on Mar. 1, 2005 under reference IPCOM000083333D, discloses, with relation to co-implantation within a Si layer, that the co-implantation parameters that help minimize roughness lead to the formation of certain defects (such as blisters at the bonding interface, or crystalline defects within the thickness of the taken-off layer), and reciprocally the co-implantation parameters that help minimizing such defects generally lead to increased roughness. In other words, a compromise has to be made between roughness and formation of these defects, and the recourse to co-implantation thus does not allow the skilled artisan to satisfactorily solve the above mentioned problems relating to the presence of defects and superficial roughness of the detached surface. Thus, improvements in these type processes are desired and needed.

SUMMARY OF THE INVENTION

This invention overcomes the problems of the prior art by providing simplified methods for forming semiconductor structures. One embodiment of this invention comprises: providing a donor wafer having a first semiconductor layer and a second semiconductor layer on the first layer and having a free surface; coimplanting two different atomic species through the free surface of the second layer to form a zone of weakness zone in the first layer; bonding the free surface of the second layer to a host wafer; and supplying energy to detach at the zone of weakness a semiconductor structure comprising the host wafer, the second layer and a portion of the first layer. Advantageously, the donor wafer comprises a SiGe layer, and the co-implantation of atomic species is conducted according to implantation parameters adapted to enable a first species to form the zone of weakness in the SiGe layer, and to enable a second species to provide a concentration peak located beneath the zone of weakness in the donor wafer to thus minimize surface roughness resulting from detachment at the zone of weakness.

Preferably, the first species is hydrogen and the second species is helium with the helium provided at a dose accounting for approximately 30% to 70% and preferably 40% to 60% of the total dose of hydrogen and helium. More particularly, in a highly preferred embodiment, hydrogen is provided at a dose of about $1 \times 10^{16}/cm^2$, and helium is provided at a dose of about $0.9 \times 10^{16}/cm^2$. Thus, the implantation parameters can be selected to provide a surface roughness of the second layer immediately after detachment that is less than about 40 Å RMS measured on a 10×10 μm portion of the surface.

If desired, the method further comprises conducting a bond strengthening step on the structure after detachment at a temperature of less than about 800° C. to improve the strength of the bond between the second layer and the host wafer. Preferably, the bond strengthening step is carried out at a temperature comprised between 575° C. and 625° C. to provide a bonding energy that is greater than or equal to about 0.8 J/m².

The method may also beneficially include selectively etching the first layer portion to remove it from the structure and to expose a surface of the second layer. After selectively etching, growing a layer of the second material on the second layer to increase its thickness. In a preferred embodiment, the first layer is made of $Si_{1-x}Ge_x$ where $0<x \leq 1$, and the second layer is made of elastically strained Si that is provided at a thickness that is greater than a critical equilibrium thickness. In addition, the donor wafer comprises a support substrate made of solid Si, a buffer structure made of SiGe, a first layer comprising $Si_{1-x}Ge_x$ ($x \neq 0$), and a second layer made of strained Si, or the first layer is made of elastically strained SiGe, and the second layer is made of $Si_{1-x}Ge_x$ where $0<x \leq 1$.

In a beneficial embodiment, the first layer is made of elastically strained SiGe, and the second layer is made of $Si_{1-x}Ge_x$ where $0<x \leq 1$ and the donor wafer comprises a third layer made of $Si_{1-x}Ge_x$ located under the first layer. In addition, implanting may occur under the first layer, and may further include selectively etching a portion of the third layer to the level of the first layer after the detachment step. In an implementation, the donor wafer includes a support substrate made of solid Si, a buffer structure made of SiGe, and a multi-layer structure alternately comprising first layers made of $si_{1-x}Ge_x$ ($x \neq 0$) and second layers made of strained Si. Such a structure permits several layer transfers from the same donor wafer, wherein each strained Si layer is provided at a thickness that is greater than a critical equilibrium thickness. In addition, prior to implanting, the method may include forming the strained layer at a deposit temperature of between about 450° C. and about 650° C. The treatments used between the deposit and the detachment steps are conducted at temperatures less than or equal to the deposit temperature.

In yet another beneficial embodiment, the method according to the invention includes, prior to bonding, forming a bonding layer comprising an electrically insulating material on the second layer, the host wafer, or both. In this case, the electrically insulating material may be at least one of $SiO_2$, $Si_3N_4$ or $Si_xO_yN_z$.

Use of the methods according to the invention reduces the duration, the economic cost and the number of treatments utilized on a transferred layer, and removes the need for mechanical polishing. Use of a method according to the invention also prevents delamination of the edge of the bonding layer when a chemical etching finishing process is used. In addition, the present method permits the creation of a structure, such as a semiconductor on insulator structure, that includes a transfer layer of a material weaker than Si, such as strained Si or SiGe. The resulting structure also has a layer of better quality than those of other methods, and the inventive process reduces the quantity of wasted material used when treating the transfer layer. Moreover, the present invention provides a simplified method of treating the transfer layer that can be easily incorporated into a SMART-CUT® process.

BRIEF DESCRIPTION OF THE DRAWING FIGURES

Other aspects, purposes and advantages of the invention will become clear after reading the following detailed description with reference to the attached drawings, in which.

FIGS. 3a to 3e diagrammatically illustrate the different steps of a method according to the invention for forming a structure comprising a transferred layer by using the SMART-CUT® method.

Figure 3A:
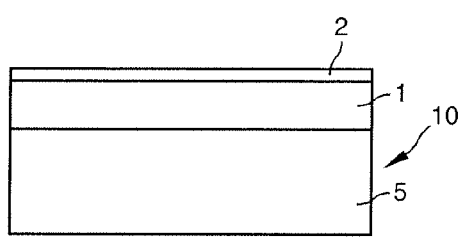
Figure 3B:
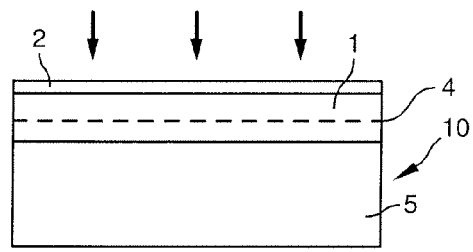
Figure 3C:
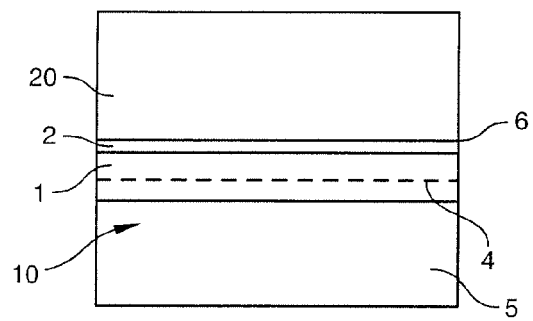
Figure 3D:
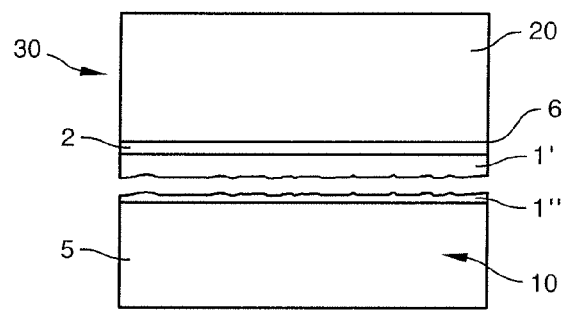
Figure 3E:
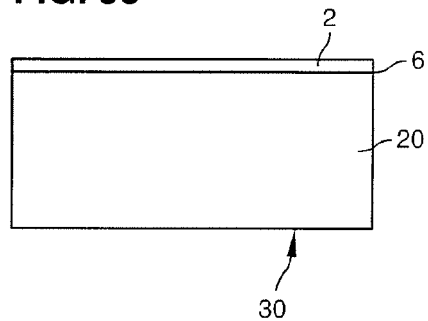
Figure 4:
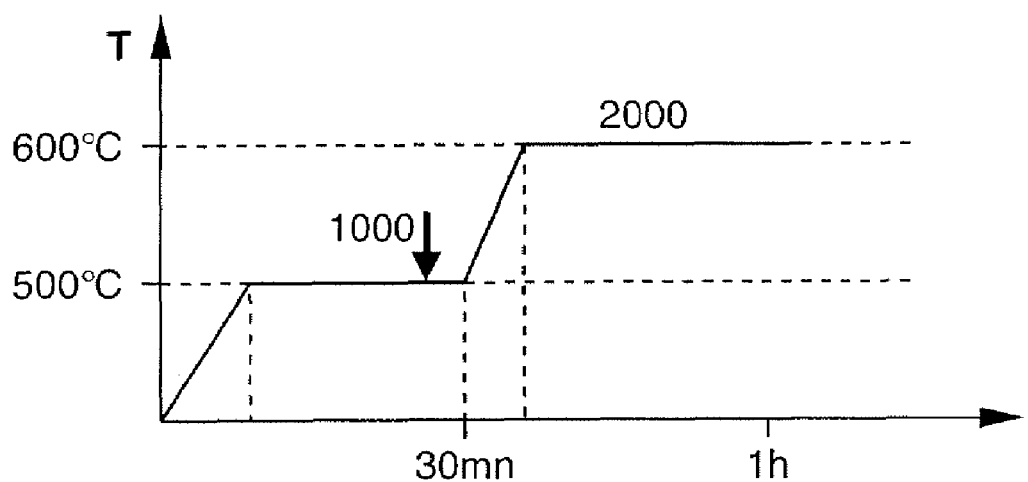

FIG. 4 is a graph illustrating a first set of heat treatment temperatures over time that may be used according to the invention, during the separation step and during the treatment of the transferred layer according to the method shown in FIGS. 3a to 3e.

Figure 5:
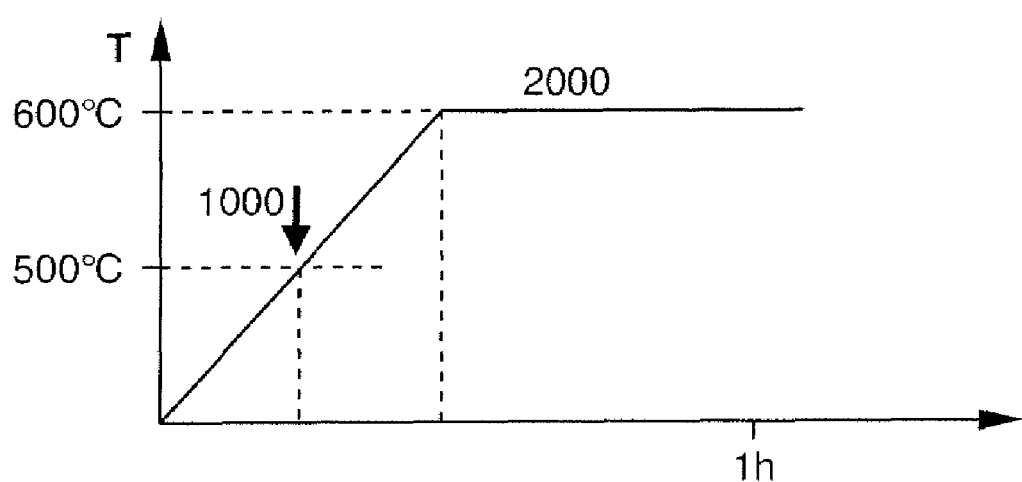

FIG. 5 is a graph illustrating a second set of heat treatment temperatures over time that may be used according to the invention, during the separation step and during the treatment of the transferred layer according to the method shown in FIGS. 3a to 3e.

Figure 6A:
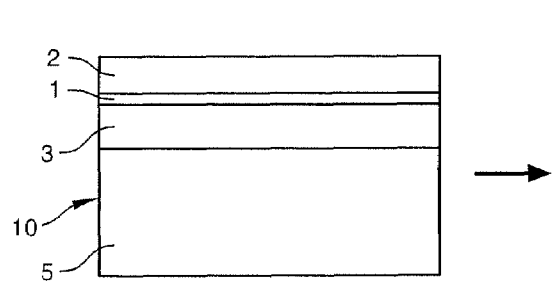
Figure 6B:
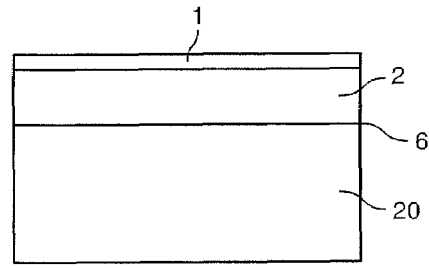

FIGS. 6a and 6b diagrammatically illustrate a first variant according to the invention.

Figure 7A:
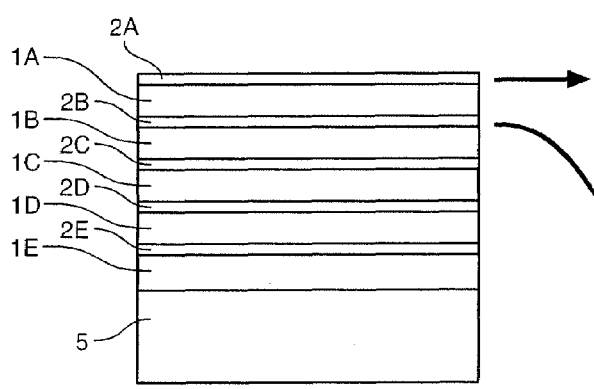
Figure 7B:
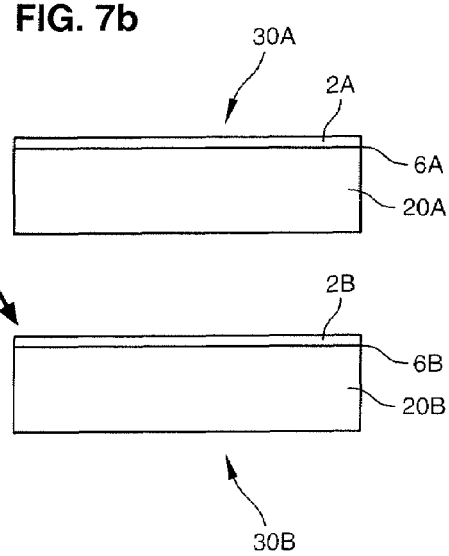

FIGS. 7a and 7b diagrammatically illustrate a second variant according to the invention.

Figure 8A:
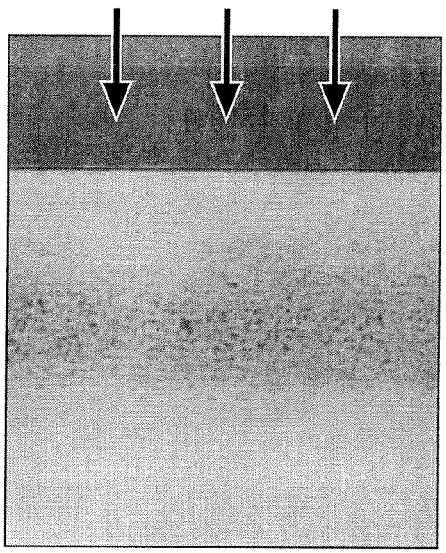
Figure 8B:
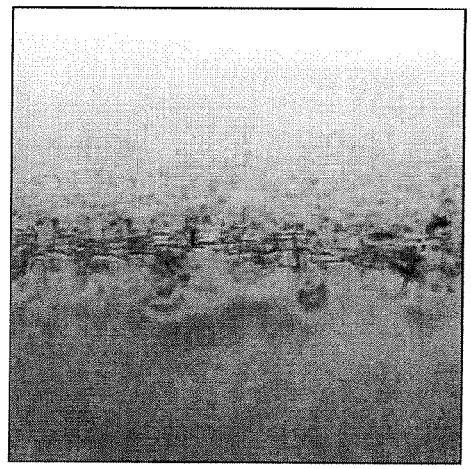
Figure 8C:
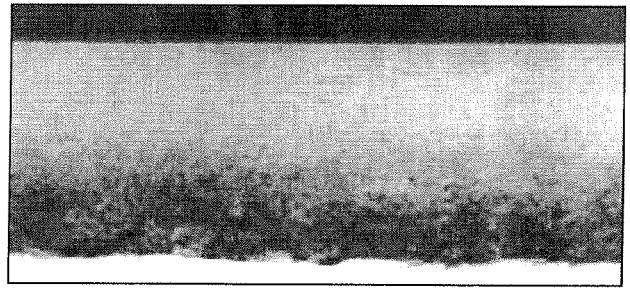

FIGS. 8a, 8b and 8c represent cross sectional views obtained by TEM of a Si donor wafer having been subjected to a He/H co-implantation.

Figure 9:
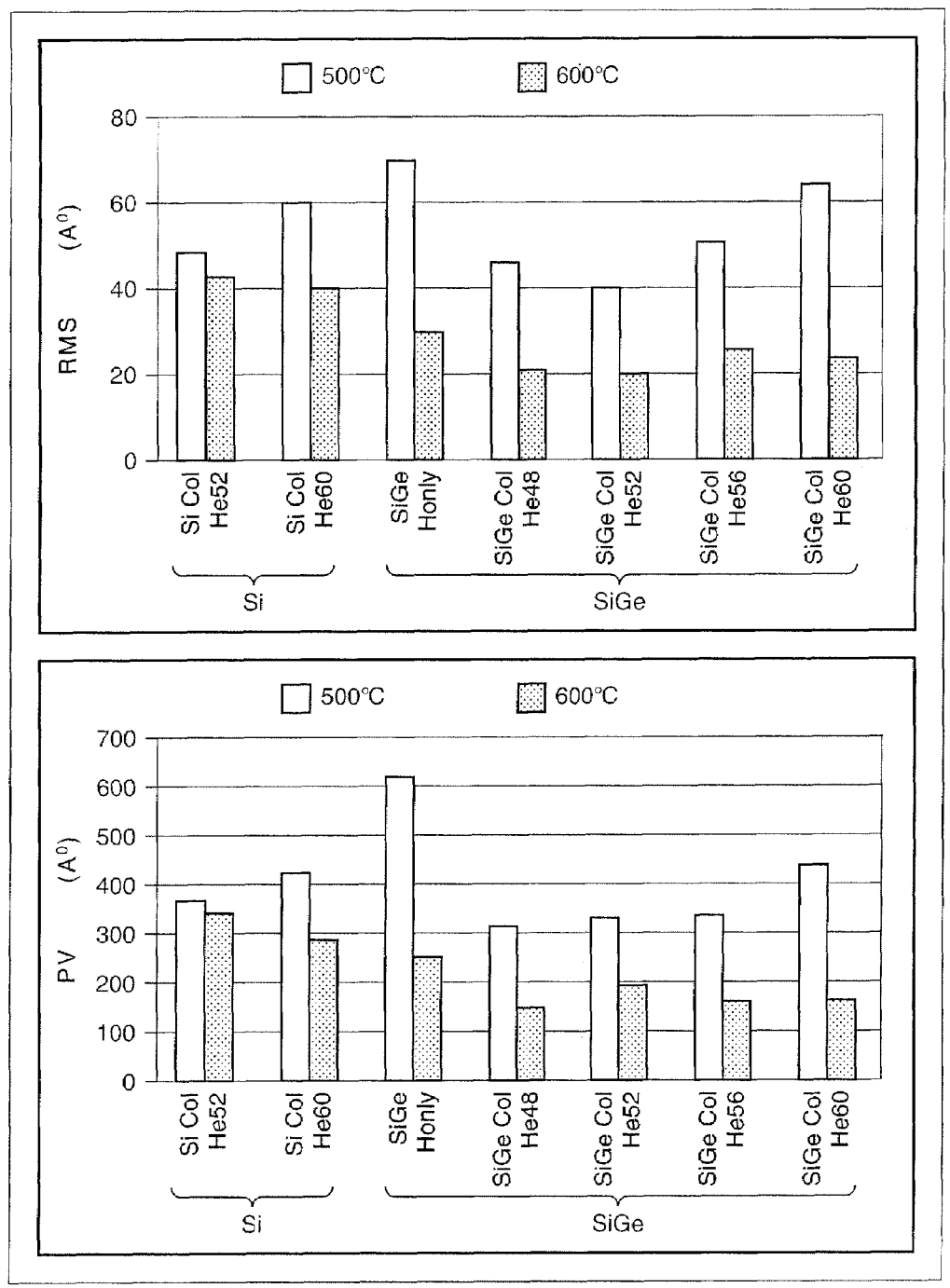
Figure 10:
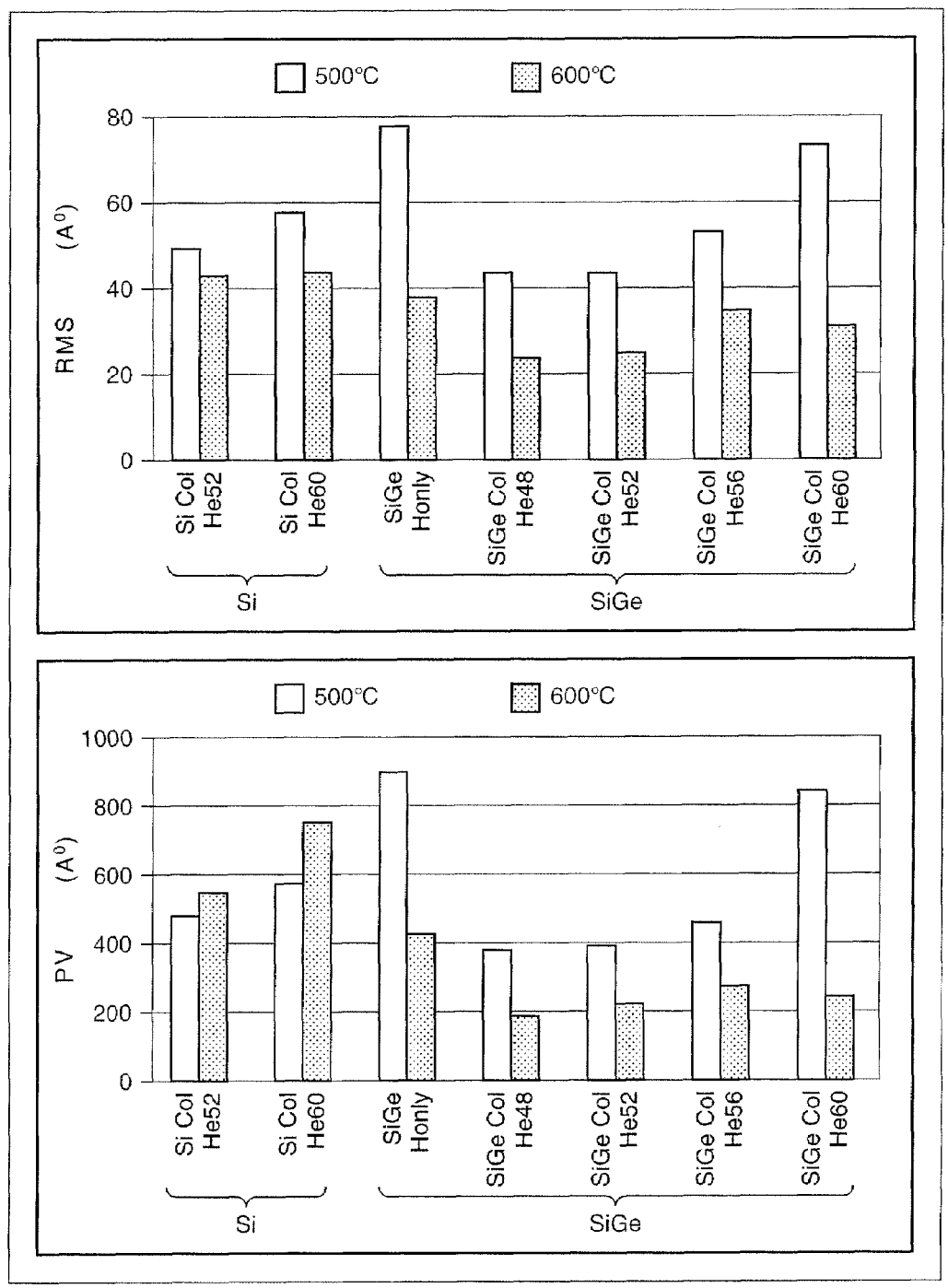
Figure 11:
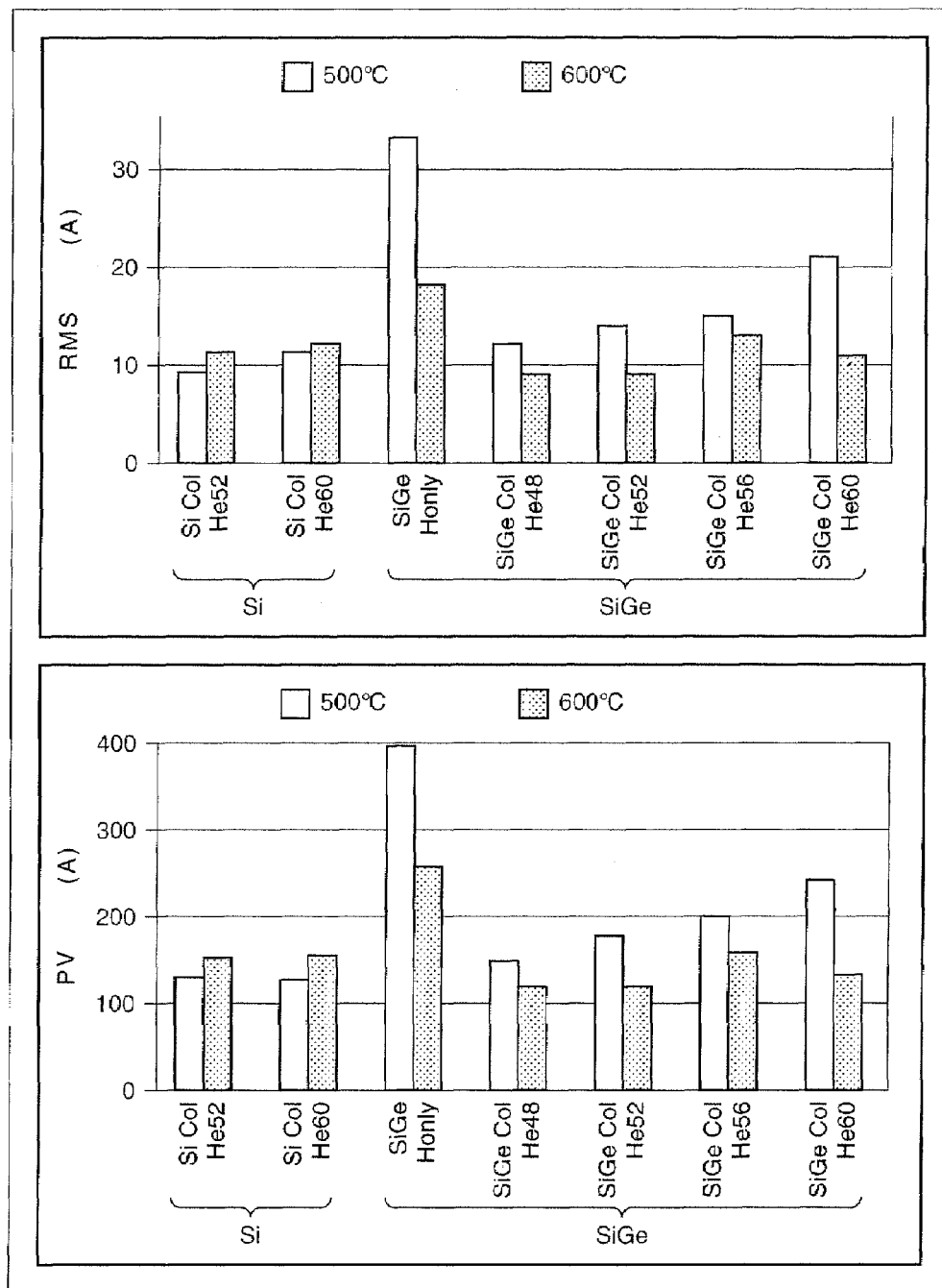

FIGS. 9, 10 and 11 present surface roughness measurements notably on structures respectively including a taken-off layer comprising Si and SiGe.

Figure 12:
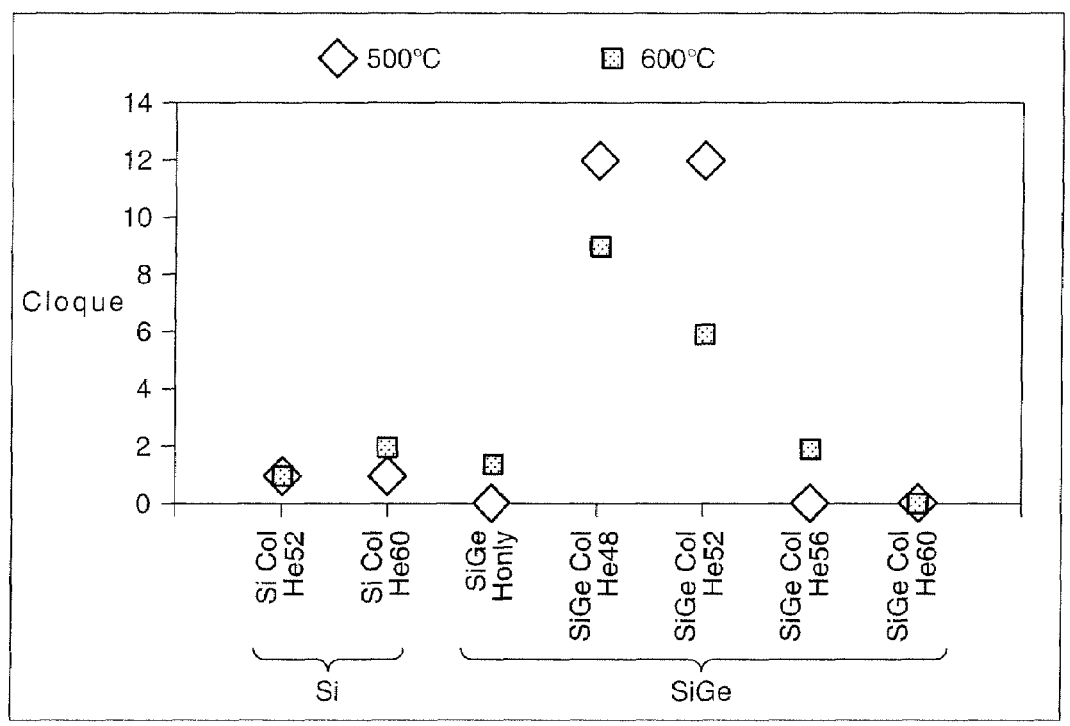

FIG. 12 notably presents defects quantification results for structures including a taken-off layer comprising respectively Si and SiGe.

DETAILED DESCRIPTION OF THE PREFERRED EMBODIMENTS

Presented are example embodiments of methods according to the invention, as well as applications based on the transfer of layers using the SMART-CUT® method with Type IV materials or alloys, and in particular with Si and SiGe.

The invention provides a number of improvements and advantages over prior art processes. The present methods reduce the duration, the economic cost and the number of treatments for the taken-off layer, and in particular to avoid using mechanical polishing. It also seeks to avoid delamination of the edge of the bonding layer when the finishing chemical etching takes place. Thus, the method can be used to create a structure, such as a semiconductor on insulator structure, comprising a taken-off layer including more weak material than Si, such as strained Si or SiGe, from a sampled layer of better quality material. Another benefit is that the quantity of material wasted when treating the taken-off layer is reduced. Thus, the invention proposes a simple method of treating the taken-off layer that can easily be incorporated into the entire sampling of SMART-CUT® type methods.

In one embodiment, the technique includes providing a donor wafer having a first semiconductor layer and a second semiconductor layer on the first layer and having a free surface, implanting atomic species through the free surface of the second layer to form a zone of weakness zone in the first layer, and bonding the free surface of the second layer to a host wafer. The method also includes supplying energy to detach at the zone of weakness a semiconductor structure comprising the host wafer, the second layer and a portion of the first layer, conducting a bond strengthening step on the structure after detachment at a temperature of less than about 800° C. to improve the strength of the bond between the second layer and the host wafer, and selectively etching the first layer portion to remove it from the structure and to expose a surface of the second layer. The implanting step includes implantation parameters chosen to minimize surface roughness resulting from detachment at the zone of weakness.

Advantageously, the bond strengthening step is conducted to provide a bonding energy that is greater than or equal to about 0.8 J/m$^2$. In addition, the implantation parameters are selected to provide a surface roughness of the second layer immediately after detachment that is less than about 40 Å RMS measured on a 10×10 μm portion of the surface.

In a beneficial embodiment, the bond strengthening step comprises conducting plasma activation on the free surface of the second layer, the host wafer or both prior to bonding. In a variation, the bond strengthening step comprises conducting a heat treatment on the detached structure. The bond strengthening heat treatment may be carried out at a temperature of above about 550° C. but less than 800° C. for between about 30 minutes and about 4 hours. In a beneficial implementation, the supplying of energy may include heating the structure in a furnace to a temperature that causes detachment, and the bond strengthening heat treatment is then conducted after detachment occurs and without removing the structure from the furnace. In such a case, the bond strengthening heat treatment may include a single temperature change from the detachment temperature to a second temperature that is selected for the bond strengthening heat treatment. The energy supplied to detach the structure from the donor wafer may include heating the structure at a temperature of about 500° C. for a time of about 30 minutes to about 2 hours. In another advantageous implementation, the method includes conducting a heat treatment after the bond strengthening step to further strengthen the bond. In this case, the further bond strengthening heat treatment may be conducted at a temperature of above about 350° C. but less than 800° C. for between about 30 minutes and about 4 hours.

FIGS. 3a to 3e illustrate a first method for transferring a first layer 1 of $si_{1-x}Ge_x$ (where x ϵ[0;1]) and a second layer 2 of elastically strained Si from a donor wafer 10 to a host wafer 20. FIG. 3a shows a donor wafer 10 that includes the first layer 1 made of $si_{1-x}Ge_x$ and the second layer 2 made of elastically strained Si. Classically, a donor wafer 10 including $si_{1-x}Ge_x$ comprises a solid Si substrate 5 on which a buffer structure of SiGe has been formed, for example by crystalline growth, that is made up of different layers. In particular, the buffer structure may be fabricated to have a gradual increasing amount of Ge, starting from 0% at the level of the solid Si substrate to about 100% at the level of the interface with the first layer 1 made of $si_{1-x}Ge_x$ (also preferably formed by crystalline growth). A second layer 2 of strained Si is formed on the first layer 1 of $si_{1-x}Ge_x$. In a first case, the growth of the second layer 2 is carried out in situ, continuing directly after the formation of the first layer 1. In a second case, the second layer 2 is grown after the surface of the first layer has been lightly prepared, for example by CMP polishing. A second layer 2 made of Si is advantageously formed by epitaxy using known techniques such as the Chemical Vapor Deposition (CVD) and Molecular Beam Epitaxy (MBE) techniques.

The silicon of the second layer 2 is then biased by the first layer 1 to increase its nominal mesh parameter to make it more or less identical to that of its growth substrate, and thus to present internal elastic strain tensions. It is necessary to form a second layer 2 that is quite thin because if the layer is too thick, thicker than a critical equilibrium thickness, then a relaxation of the strain would result in the film thickness towards the nominal lattice parameter of the silicon and/or faults would be generated. Details on this subject can be found in "High mobility Si and Ge Structures" by Friedrich Schaffler ("Semiconductor Science Technology", 12 (1997) 1515-1549). However, in the particular case of a deposit of strained material at a sufficiently low temperature, it may become possible to form such a second strained layer 2 with a thickness greater than the critical balance thickness (discussed below).

FIG. 3b illustrates the formation of a zone of weakness 4 in the donor wafer 10 underneath the second layer 2. In particular, implantation may occur in the first layer 1 made of $si_{1-x}Ge_x$ (not shown in FIG. 3b). The zone of weakness 4 is formed by implanting atomic species at a dosage, nature and energy chosen so that a predetermined depth of implantation and a level of weakness results. In particular, the parameters determining the implantation of atomic types are adjusted to minimize the surface roughness which appears at the level of the zone of weakness 4 after detachment occurs. In fact, the extent of the post-detachment surface roughness is partially caused by the parameters that define the implanting used, as explained below. Thus, in a preferred embodiment, the implantation of atomic species may be a co-implantation of atomic species (wherein at least two atomic elements are implanted). For example, a co-implantation of hydrogen, helium or argon, or another rare gas, or another suitable gas. In an implementation, co-implanting involves implanting a first species at a predetermined energy, and then implanting a second species at a predetermined energy. It has been observed that, when co-implantation is used, the zone of weakness 4 is generally thinner than when a simple implantation is used (see study below). The energy used for implanting is chosen so that an implantation depth results that is within the thickness of the first layer 1. Thus, for a co-implantation of helium of about $0.9 \times 10^{16}/cm^2$ and an energy value of between about 50 and about 90 kev and hydrogen of about $1.0 \times 10^{16}/cm^2$ and an energy of between about 20 and about 60 kev, a depth of implantation is obtained of about 300 to 600 nanometers. One advantage of co-implantation is that it allows for the taking-off of a thin layer using a total dose of co-implanted species that is significantly lower than the dose to be used when a single species is implanted. The total dose used for co-implantation thus typically represents ⅓ of the single species implantation dose. Also, a post-detachment surface roughness is obtained that is lower than the roughness obtained with a simple hydrogen or helium implantation. The surface roughness is typically less than around 40 Å RMS as measured on a surface of 10×10 μm.

FIG. 3c shows a bonding step wherein a host wafer 20 is bonded to the side of the donor wafer 10 that underwent the co-implantation process. The host wafer 20 may be made of solid Si or other materials. Prior to implanting, a bonding layer may be formed on one and/or the other of the respective surfaces to be bonded. Such a bonding layer may be made of $SiO_2$, $Si_3N_4$, $Si_xO_yN_z$. The bonding layer may be formed by a deposit of material to avoid any deterioration of the strains in the second layer 2 or to avoid any consequential diffusion in the first layer 1.

Before bonding the host wafer 20 to the donor wafer 10, the bonding surfaces may be prepared by using known surface cleaning and polishing techniques, such as SC1 and SC2 solutions, ozone solutions, and the like. The bonding itself may be conducted by molecular adhesion, by being able to take account of the hydrophobic properties of each of the two bonding surfaces. It is also possible to use plasma activation of one or both of the bonding surfaces just prior to bonding. Plasma activation permits in particular the creation of handling bonds, for example on an oxide surface, or on the surface(s) to be treated. The bonding forces are thus increased and the number of defects reduced at the bonding interface 6. Such strengthening of the bonding interface 6 has the advantage of making the interface much more resistant to chemical attacks from etching (which is used when finishing the surface of the transferred layer), and avoids delamination problems that could occur at the edges as mentioned previously, which may typically appear for a bonding energy below approximately 0.8 $J/m^2$. In particular, plasma activation is used so that in the end, after bonding and after transferring layers, the bonding energy is greater than or equal to approximately 0.8 $J/m^2$. The plasma may be obtained for example from an inert gas, such as Ar or $N_2$, or from an oxidizing gas such as $O_2$.

Plasma activation is typically carried out at ambient temperature, below approximately 100° C. The use of this technique therefore also has the advantage of not causing any notable problems of diffusing Ge from the first SiGe layer 1 into the second strained Si layer (the diffusion of Ge starts to become significant in the thickness of neighboring layers when much higher temperatures are used, typically around 800° C. or more). The plasma treatment is very quick, typically taking less than one minute. Standard plasma etching equipment could be used, for example, of the RIE or ICP-RIE types or other devices.

After treating prior to bonding, an annealing heat treatment of less than 800° C., or less than a limit temperature where diffusion of Ge in the neighboring layers would become damaging, may be used later during bonding. The annealing heat treatment further strengthens the bonding and also aids in avoiding any delamination problem that may occur when conducting a post-detachment selective etching process. In contrast, heat treatments without prior plasma activation demand, for an equivalent result, temperatures greater than approximately 900° C. to be efficient, and such high temperature heat treatments cannot be used in this case due to the problems of Ge diffusion. Consequently, a bonding energy of at least 1 $J/m^2$ after an annealing heat treatment at 200° C. can be achieved, in the case of bonding preceded by plasma activation.

FIG. 3d illustrates the separation step. This is conducted by providing heat energy and/or mechanical energy that is sufficient to break the weak links at the zone of weakness 4, and thus detach the donor wafer 10 into a first part that includes first layer remainder 1" and the donor wafer, and into a second part 30 that includes the other part of the first layer 1', the second layer 2 and the host wafer 20. The heat energy may then be sufficient to cause, at the zone of weakness 4 level, thermal effects on the gaseous types enclosed therein to cause the rupture of weak links. Detachment may be obtained at temperatures of between around 300° C. and around 600° C. for durations of varying lengths, which depend on whether the temperature is lower (longer) or higher (shorter). For example, for a layer to be transferred made of $si_{1-x}Ge_x$, a heat treatment at a temperature of around 500° C. could be used for a duration that can range from about 15 to about 30 minutes up to about 2 hours. When detachment is conducted solely by heat treatment, this may allow detachment to occur without necessarily ending the contact with the remaining part of the donor wafer. In this last case, and optionally, a new heat treatment method may be conducted directly after the separation, without removing the wafers from the furnace (in which the separation heat treatment method took place). Thus, no additional handling would be required that would be a waste of time and would require the use of appropriate equipment. Moreover, the remaining part of the donor wafer 10' offers protection to the first and second transfer layers 1' and 2' against any possible contaminants, oxidants, or other such agents, which offers the possibility of again using a heat treatment in various atmospheres. A heat treatment could also be conducted after the wafers have been physically separated (and removed from the furnace). In this way, according to a variant of the method, a heat treatment can be used to strengthen the bonding interface 6 directly after separation. This heat treatment may be used in addition to or in replacement of the plasma activation that may possibly be used before bonding (see above).

In the case of heat treatment being used in addition to plasma activation, it is possible to ensure that the combined effects of the two treatments achieve the desired objectives. In particular, the result is a bonding energy sufficient to make the bonding interface 6 resistant to chemical attack from later etching, and thus avoids delamination problems on the edges as previously described. The two treatments can thus be combined to strengthen the bonding interface 6 to obtain a bonding energy greater than or equal to approximately 0.8 $J/m^2$. In any case, the heat treatment for strengthening the bonding interface 6 is carried out at a temperature $T_2$ that is chosen to be below the temperature above which the Ge diffuses significantly into the thickness of the second layer 2. This heat treatment is chosen to strengthen the bonding sufficiently to prevent any risk of delamination at the edges during the selective etching that will be used after the transfer of layers. In particular, the heat treatment may be used to obtain as a result a bonding energy higher than or equal to approximately 0.8 J/m². The heat treatment to strengthen the bonding interface 6 is carried out at a temperature $T_2$ lower than or equal to approximately 800° C.

When the remaining part 10' of the donor wafer and the structure 30 are still in contact after detachment, the heat treatment to strengthen the bonding interface 6 is conducted at a temperature that is lower than the re-adhesion temperature from which the two parts 1' and 1" of the first layer would re-adhere (or rejoin). The re-adhesion temperature being considered here, and based on experience working with SiGe, is over approximately 800° C. Optionally, the temperature $T_2$ may be greater than the temperature $T_1$ that the wafers 10 and 20 were subjected to when detached. This heat treatment to strengthen the bonding is carried out in an inert atmosphere (such as an Ar or $N_2$ atmosphere) that is oxidizing or slightly oxidizing. The temperature $T_2$ may for example be situated between about 350° C. and about 800° C., and maintained for between about 30 minutes and about 4 hours. More particularly, the temperature $T_2$ may be situated between about 550° C. and about 800° C., and maintained for between about 30 minutes and about 4 hours.

FIGS. 4 and 5 illustrate examples of possible temperature changes during joining phases and strengthening of the bonding interface 6. With reference to FIG. 4, a first plateau of around 500° C. is reached and maintained for around 30 minutes to create at the end a detachment (arrow 1000), then the temperature is increased to approximately 600° C. to conduct a heat treatment to strengthen the bonding interface 6 (at the level of the temperature plateau 2000). The bonding interface 6 strengthening heat treatment may last for about 2 hours or more.

FIG. 5 illustrates the case where detachment does not occur during a temperature plateau, but occurs during a temperature increase of around 500° C. (at the arrow 1000). The bonding interface 6 strengthening temperature plateau 2000 is then reached at around 600° C. Surprisingly, it has been observed that by using such a bonding interface 6 strengthening step, in particular when it is followed by a co-implantation step, the transferred layers exhibit an improved crystalline quality in their parts that used to be damaged during the implantation step (see FIG. 3b) and during detachment (see FIG. 3d). Furthermore, the transferred layers exhibit a smoothed surface, in particular for high frequency roughness (HF roughness), and have a bonding energy greater than approximately 0.8 J/m² (without plasma activation).

As shown in FIG. 3d, after removing the remaining part of the donor wafer 10' from its contact with the transferred layers 1' and 2, a structure 30 is obtained that includes the host wafer 20, the second layer 2 and the remaining part of the first layer 1'. This structure 30 has an improved crystalline quality and reduced surface roughness, without having a need for an intermediate polishing operation. When an electrically insulating layer being formed between the second layer 2 and the host wafer 20 beforehand, then a SiGe/sSOI or Ge/sSOI structure is obtained. A finishing step is then used to remove the slight roughness and few remaining crystalline defects at the surface, and such a finishing step may utilize chemical etching.

The mechanical polishing means used prior to chemical etching to reduce the surface roughness (and therefore to make the different points of the etching more homogeneous), does not necessarily need to be included. In fact, the co-implantation process ensures a much smoother sampling surface than that obtained by simple implantation. Furthermore, the bonding strengthening heat treatment allows this roughness to be substantially diminished, as described above, and to increase the bonding energy.

The $si_{1-x}Ge_x$ layer 1' may possibly be removed in order to obtain a final sSOI structure. It is then possible to make the strained silicon of this structure thicker by epitaxy. To remove the layer 1' of $si_{1-x}Ge_x$ selectively, it is possible to use selective etching by using for example $HF:H_2O_2:CH_3COOH$, SC1 ($NH_4OH/H_2O_2/H_2O$) or HNA ($HF/HNO_3/H_2O$). A selectivity of around 40:1 between the SiGe and the sSi may be obtained with $CH_3COOH/H_2O_2/HF$. The concentration that may be chosen for the $CH_3COOH/H_2O_2/HF$ can range from a ratio of $H_2O_2/HF$ that is between 1/1 (very concentrated) and 20/1. The length of the etching is directly correlated with the speed of etching. It is typically around 5 minutes for 800 Å to be etched with $CH_3COOH/H_2O_2/HF$.

Thus, co-implantation and the possible use of a bonding strengthening heat treatment considerably reduce the surface roughness and the non-uniformities of thickness in the transferred layers 1' and 2. Thus, it is possible to use more or less the same selective etching process as those of the state of the art, but the disadvantages that they can present have been eliminated, such as the need to use a prior mechanical polishing means. Moreover the bonding strengthening (conducted by plasma activation and/or by using a post-separation heat treatment) is sufficient to eliminate the problems of delamination at the edges, which was mentioned earlier.

Figure 1:
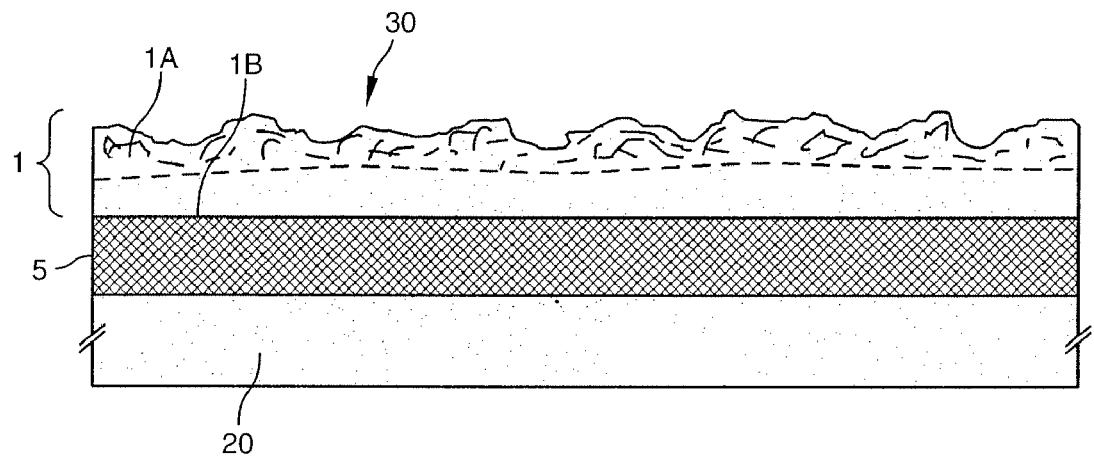
FIG. 1 is a diagrammatical cross section of a semiconductor on insulator structure obtained after using the SMART-CUT® method.
Figure 2:
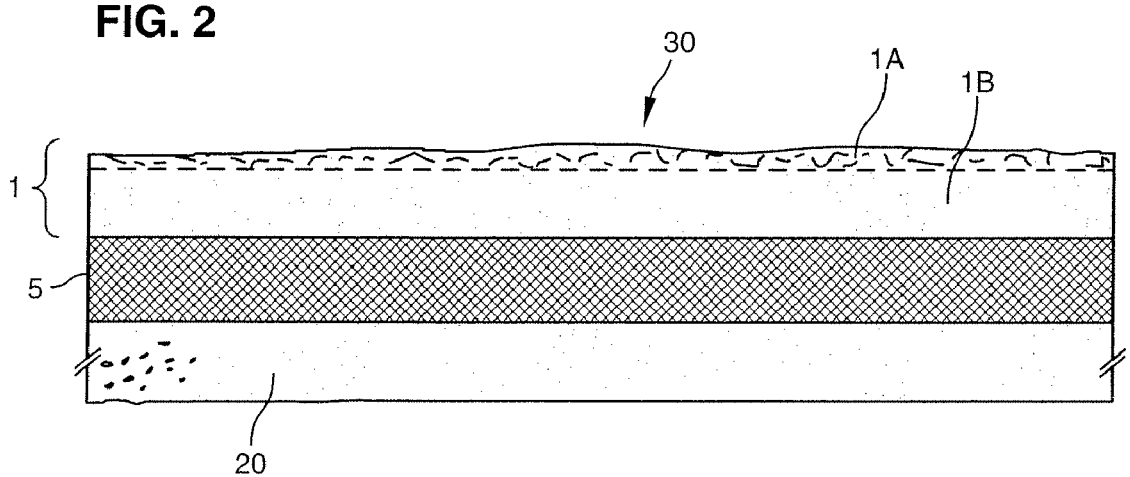
FIG. 2 is a cross sectional view obtained by TEM of a semiconductor on insulator structure obtained after using the method according to the invention.

FIG. 2 shows a structure 30 of SiGeOI having 20% Ge (photographed by TEM) following a transfer of a single layer of $Si_{0.8}Ge_{0.2}$ in which the zone of weakness has been created, and following a post-detachment heat treatment at 600° C. FIG. 2 also shows a transfer layer 1 of $Si_{0.8}Ge_{0.2}$ (the equivalent of the first layer 1 and second layer 2 together, previously discussed with reference to FIGS. 3a to 3e) covering a layer of $SiO_2$ 5, that includes very few crystalline defects and very little roughness with respect to the semiconductor on insulator structure of FIG. 1. In particular, the disproportion between the thickness of the defective zone 1A of the transfer layer 1 shown in FIG. 1 and that of the remedied transfer layer 1 shown in FIG. 2 should be noted. Similarly, and for the same thickness of a transfer layer 1 for FIG. 1 and for FIG. 2, the sound zone 1B of FIG. 2 is much greater proportionally in the SiGeOI obtained according to the present method than in the semiconductor-on-insulator according to the prior art.

The results of surface roughness measurements made on such a SiGeOI structure having 20% Ge are presented in the table below. These measurements were made just after detachment at about 500° C. for about 30 minutes following simple implantations or co-implantations, and at a bonding strengthening heat treatment (post separation) at about 500° C. or about 600° C. The roughness was measured and the values are given in RMS or peak to valley (PV) by AFM on surface areas of 10×10 μm. It should also be noted that a sufficient number of measurements were made to validate the results.

| Nature of the implantation | Bonding strengthening treatment | Surface roughness RMS (Å) | PV (Å) |
|---|---|---|---|
| Simple implantation H: 40 keV-6.10$^{16}$/cm$^2$ | 500° C./30 min. 600° C./30 min. | 80-85 38 | 850 420 |
| Co- implantation of H and He: H: 35 keV-1.0.10$^{16}$/cm$^2$ He: 70 keV-0.9.10$^{16}$/cm$^2$ | 500° C./30 min. 600° C./30 min. | 49 33 | 407 272 |

In the above table, it is noted that the surface roughness is less significant when a co-implantation process is used than when a simple implantation is used. Thus, the influence of the nature of the implantation made in SiGe to form a zone of weakness 4 is highlighted. Concerning the extent of the post-detachment roughness which appears, a helium-hydrogen co-implantation permits the roughness of the SiGe layer 1 to be substantially reduced with respect to a simple hydrogen implantation.

In the table, it can also be noted that, in the case of a co-implantation, a post-detachment bonding strengthening heat treatment at 600° C. reduces by almost a third both the mean (RMS) and maximum (PV) roughness with respect to the same heat treatment conducted at the detachment temperature (approximately 500° C.). The roughness is less than 40 Å RMS or may be even less than 35 Å RMS, and below 300 Å PV or may be even below 275 Å PV. It has thus been established that there is significantly less roughness when the transferred layer 1 has undergone a post-detachment bonding strengthening heat treatment. Referring to FIG. 3e, a sSOI structure 30 is finally obtained.

When one or more bonding layers is buried under the bonding interface 6, a heat treatment may possibly be used to further strengthen the bonding, in particular by creating covalent links. This bonding strengthening heat treatment may be carried out at a temperature of over 800° C., given that there is no more SiGe or Ge in the structure 30, and consequently there are no more diffusion considerations for Ge (because the remainder of the first layer 1' has been completely removed). A subsequent crystalline growth step may be used (for example MBE or CVD epitaxy) to thicken the second layer of strained Si.

Other roughness measurements on a sSI structure (for which a strained Si layer has been deposited on a SiGe layer comprising 20% of Ge) are presented hereafter. These results more particularly concern certain detachment parameters, and notably several co-implantation parameters. The Background explains the different problems encountered when forming a structure comprising a Si layer taken off from a donor wafer by a SMART-CUT® type process. These problems (and a solution to cure them) are discussed in International application PCT/IB2004/003300 and its U.S. equivalent filed of even date hereof. The use of co-implantation can indeed lead to the formation of blisters at the bonding interface and of defects within the thickness of the taken off layer. Particles or organic substances present on one and/or the other of the wafers to be bonded can prevent the bonding to be carried out in a successful manner at certain regions of the bonding interface. The implanted species may then diffuse to the weakly bonded bonding interface regions, forming blisters at the level of the bonding interface. Furthermore, in certain locations, the bonding energy may be insufficient to allow detachment of the donor wafer layer. Certain zones of the taken off layer may then not be transferred onto the host wafer (these zones are communally designated under the term of "non transferred zones" or NTZ). In addition, nanocavity crystalline defects (presenting a diameter of a few nanometers) may be observed within the thickness of the taken off layer beyond the defective zone, depending upon the chosen co-implantation conditions. These defects can result from an agglomeration of Si or Ge atoms that are displaced during implantation. In particular, when helium is implanted at the same depth as hydrogen, these nano-cavities type defects are observed within the thickness of the taken off layer. While these defects are located beyond the defective zone, they are as undesirable as defects present in the defective zone. The appearance of these defects necessitates the removal after detachment of a greater thickness of material than usually necessary, and thus necessitates the taking off of a thicker layer to provide sufficient material to compensate for the amount that has to be removed.

In reference to the views of FIGS. 8a, 8b et 8c obtained by TEM, a co-implantation of helium and hydrogen in a Si donor wafer for the taken off of a layer following a thermal detachment treatment is represented. FIG. 8a represents a view obtained by TEM photography of a Si donor wafer having been subjected (see arrows) to a co-implantation of both helium and hydrogen atomic species. The distribution of these species in the thickness of the donor wafer is perceptible (see dark points) in FIG. 8a. After bonding to a host wafer, a thermal treatment leads to the disunion or detachment at the weakness zone (see FIG. 8b). FIG. 8c represents (in reversed sight compared to FIG. 2) the taken-off layer after detachment and transfer onto a host wafer. In this FIG. 8c, one can see the defective zone close to the surface, as well as the presence of defects (dark points) in the thickness of the taken-off layer.

Each of the implanted species is distributed within the thickness of the donor wafer according to a repartition profile having a spreading zone within which the species is mainly concentrated and presenting a maximum concentration peak. More precisely, the repartition has a quasi-Gaussian profile presenting a standard deviation (defining the spreading zone wherein the species is mainly distributed, for instance within which one finds 70% of the implanted species) and a maximum concentration peak which notably depends upon the implantation energy. The helium atoms diffuse within the Si matrix more easily than the hydrogen atoms. Hence if helium is implanted close to the bonding interface, these is an increased risk that blisters or crystalline defects beyond the defective zone will form. One way to cure this problem is to implant helium more deeply than hydrogen, so that the hydrogen containing region is present to block the diffusion of helium. It is more precisely a question of controlling the co-implantation parameters so that the helium peak is located more deeply than the hydrogen spreading zone.

However, it also has been shown that the roughness after detachment does not follow the same tendency, and tends to increase when helium is implanted more deeply than hydrogen. This signifies that the implantation conditions (i.e. implantation doses and energies) do not allow the independent controlling of the roughness and the formation of blisters and crystalline defects beyond the defective zone. It is thus necessary to make a compromise between the best parameters for limitation of the formation of blisters and defects and the best parameters for limitation of the surface roughness.

A solution making it possible to overcome this problem has already proposed in the previously mentioned International application, PCT/IB2004/003300. Generally speaking, this solution includes precisely controlling the relative position of the hydrogen and helium peaks in the implanted donor wafer, with the helium peak being located at the level of the embrittlement or weakness zone and more deeply than the hydrogen spreading zone, and in jointly controlling the dose of each species, with the helium dose accounting for approximately 40% to 60% of the total amount. By carrying out the step of implantation by co-implanting according to these parameters, a satisfactory compromise can be found between roughness and formation of defects. Experiments carried out on the detachment at the level of layers containing Ge (typically layers of SiGe comprising more than 15% Ge) led to surprising results with regard to the roughness and the formation of blisters and crystalline defects beyond the defective zone.

A possible embodiment of the process according to the present invention is as follows:
- to carry out a co-implantation, typically of helium and hydrogen, in a layer of SiGe, according to implantation parameters adapted to shift the concentration peaks of helium and hydrogen, in particular so that the helium peak is located more in-depth than the hydrogen spreading zone, but also so that the helium peak is located more in-depth than the embrittlement zone, and
- to implement a post disunion recovering heat treatment at a temperature about 600° C. (+/−25° C.), to be maintained from 30 minutes to four hours, and typically for about one hour.

The implantation parameters are adapted to "place" the helium peak at a depth approximately 1.2 times deeper than the depth of the hydrogen peak. As an example, for the conditions of implantation dose and energy presented herein, this means placing the helium peak at more than 500 angströms from and beneath the hydrogen peak. The helium dose lies between 30% and 70% of the total dose (hydrogen+helium), preferably ranging between 40% and 60% of the total dose. The total dose typically represents some $10^{16}$ atoms/cm$^2$, without that number being restrictive.

Such an embodiment makes it possible to strongly reduce roughnesses (in particular those of high frequencies), and makes in addition low roughnesses independent from the helium implantation depth. It is thus possible, within the framework of this embodiment, to implant helium more deeply than hydrogen, which makes it possible to limit the formation of blisters and crystalline defects beyond the defective zone in the taken-off layer, the diffusion of helium in the transferred layer being blocked by the hydrogen spreading zone.

Consequently, this embodiment makes it possible to minimize at the same time the roughness post detachment, the number of defects of the blisters type and the number of defects found in the thickness of the taken-off layer. This results in authorizing the taking-off of a lower total thickness, which makes it possible to reduce, or all at least to simplify, the post-detachment finishing operations (polishing, selective etching, sacrificial oxidation, etc). The skilled artisan can determine the optimum dosages for any particular substrates based on the teachings herein and by conducting, if necessary, routine experimentation.

FIGS. 9 to 11 represent measurements of roughness post-detachment on a SOI structure and a SGOI structure (at 20% of Ge). These measurements were carried out just after disunion following simple implantations of hydrogen only (indicated by H only on these figures) or He/H co-implantations (indicated by CoI on these figures), and a recovering treatment of one hour, conducted at 500° C. or 600° C. More precisely, the change of the temperature at the time of the operations of disunion and bonding strengthening was as follows: maintenance of a stage at 350° C. during approximately an hour, then rise in temperature according to a slope of 5° C./mn, then maintenance of a stage (to strengthen the bonding) respectively at 500° C. and 600° C. during approximately an additional hour.

FIGS. 9 and 10 thus represent measurements of roughness at high frequencies carried out by sweeping respectively a surface area of 2×2 µm$^2$ and a surface area of 10×10 µ$^2$ using a AFM microscope. FIG. 11 represents measurements of roughness at low frequencies carried out by profilometry using a DEKTAK® tool which is available from Veeco Instruments Inc. On each of FIGS. 9 to 11, results of roughness measurement are expressed on the left in average values (RMS) and on the right in maximum values (statement). On these Figures, the results of measurement carried out following implantation in a layer of Si, and in a layer of SiGe are shown (see FIG. 9 on which columns relative respectively to Si and in SiGe are clearly distinguished). As concerns Si, two wafers subjected to He/H co-implantation were studied, using co-implantation parameters as follows:

H: 30 kev–1×10$^{16}$/cm$^2$ and He: 52 or 60 keV–1×10$^{16}$/cm$^2$

As concerns SiGe, five wafers were studied, namely a wafer subjected to an implantation of H only (H: 30 keV, 6×10$^{16}$/cm$^2$), and four others subjected to a He/H co-implantation according to the following parameters:

H: 30 keV–1×10$^{16}$/cm$^2$ and He: 48, 52, 56 or 60 keV–1×10$^{16}$/cm$^2$

FIG. 9 confirms the very interesting profit in term of high frequencies roughnesses related to the He/H co-implantation in comparison with H alone, and that it was achieved following a recovering treatment at 500° C. or at 600° C. It is also observed however that for a high temperature treatment at 600° C., roughness strongly decreases (typically by more than half) for all the alternatives, including implantation of H alone. And these values of roughness are even weaker when a co-implantation is carried out.

In addition, one can see that for a 500° C. treatment (and in a way similar to what was observed in Si), roughness tends to increase when the helium peak is located more in-depth than the embrittlement zone. On the other hand, within the framework of a high temperature treatment at 600° C., roughness is not significantly modified when one implants helium such that the helium peak is located more deeply than the embrittlement zone. One observes here an unexpected behavior, in opposition against what was observed in Si, as well as in SiGe with a 500° C. treatment. The results presented in FIGS. 10 and 11 confirm these observations.

The behavior in co-implantation, during a recovering treatment at 600° C., is surprising insofar as the phenomenon noted within the framework of a detachment on the level of a layer of Si were that of an increase in roughness when the helium implantation energy was increased (helium peak shifted more in-depth than the embrittlement zone. The phenomenon of post-detachment surfaces smoothing is thus related not only to the temperature of the recovering treatment, but also to the types of materials present in the donor wafer. In the experiments carried out, the difference lies in the presence of Ge in a wafer in SiGe, a Si wafer being obviously deprived of Ge.

With reference to FIG. 12, measurements were conducted to determine the number of defects (NTZ type blisters) present in the various transferred layers. The macroscopic observation (in grazing light) makes it possible to detect the defects of the NTZ type or blisters. One regards here the sum of these defects (NTZ+blisters) as being representative of the specific defects related to the implantation and observed post-detachment. A significant number of defects is noted in the two alternatives He: 48 keV and He: 52 keV, i.e., the alternatives for which the helium distribution profile is superimposed or quasi superimposed with the hydrogen profile (the helium peak being then "inside" the hydrogen spreading zone). On the other hand, a low number of defects is noted in the alternatives He: 56 keV and He: 60 keV, i.e., the alternatives for which the helium peak is located more in-depth than the hydrogen spreading zone. In other words, the defects of the blisters type are minimized when helium is deeply implanted (and that, in the case of a recovering operation at 600° C., without roughness being increased).

FIGS. 6a and 6b illustrate another embodiment wherein the donor wafer 10 includes, prior to transferring a first layer 1 of strained Si, a second layer 2 of $si_{1-x}Ge_x$ and a third layer 3 of $si_{1-x}Ge_x$ that is situated underneath the first layer 1. The zone of weakness is then formed under the second layer 2, for example in the third layer 3. Selective etching of the $si_{1-x}Ge_x$ may then be used after detachment in compliance with the description above, to create a final sSi/SiGeOI structure 30 (as shown in FIG. 6b) with a first layer 1 of strained Si and a second layer 2 of $si_{1-x}Ge_x$.

A second selective chemical etching of the strained Si may optionally be conducted, for example by means of chemical types based on KOH (potassium hydroxide), $NH_4OH$ (ammonium hydroxide), TMAH (tetramethyl ammonium hydroxide) or EDP (ethylene diamine/pyrocathecol/pyrazine). In this case, the first layer 1 made of strained Si plays the role of a stop layer that protects the second $si_{1-x}Ge_x$ layer 2 from the first chemical attack. A SiGeOI structure 30 (not shown) is then obtained. A layer of strained Si can also be grown on the SiGeOI, and this new strained layer may have a better quality crystalline structure than the first layer 1 which has previously been etched.

FIGS. 7a and 7b illustrate another embodiment of the invention, wherein the donor wafer 10 includes, prior to the transfer step, a multi-layer structure alternatively comprising first layers 1A, 1B, 1C, 1D, 1E of $si_{1-x}Ge_x$ (X≠0), and second layers 2A, 2B, 2C, 2D, 2E of strained Si. A number of transfer operations according to the method can thus be conducted from the same donor wafer 10, each transfer then followed by recycling the remaining part of the donor wafer 10 to prepare it for a new transfer operation. In this way, a first sSOI structure 30A and a second sSOI structure 30B will be formed from the same donor wafer 10. This type of transfer is taught in the published U.S. application 2004/0053477.

According to another embodiment, each strained layer (referenced "2" in FIGS. 3a to 3e, "1" in FIGS. 6a and 6b, and "2A", "2B", "2C", "2D" or "2E" in FIGS. 7a and 7b) of the donor wafer is thick. In particular, each such strained layer has a thickness that is greater than the critical balance thickness (the thickness above which the elastic strains start to relax) without having the relaxation of its elastic strains. This is possible due to formation by low temperature epitaxy. For example, a layer of strained Si deposited at temperatures of between approximately 450° C. and about 650° C. on a growth support of $Si_{0.8}Ge_{0.2}$ can typically reach a thickness of between approximately 30 nm and about 60 nm. If such a thick strained layer is formed in this manner, then care must be taken not to exceed a certain limit temperature (situated around the deposit temperature) in following treatments, and in particular treatments that occur between the deposit of the layer and the detachment of the layer conducted by using the SMART-CUT® process, in order to avoid relaxing the strains.

Thus, in the case of thick strained layers, a plasma activation operation will advantageously be used prior to bonding (as discussed earlier), and will typically be conducted at an ambient temperature that is lower than approximately 100° C. Furthermore, at least one bonding layer of dielectric material, such as $SiO_2$, is advantageously formed on one or both of the two surfaces that are to be bonded, and this layer is made of dielectric material that subsequently helps (after separation) to conserve the elastic strains. If no bonding layer is planned, then as a complement to the plasma activation operation a post-detachment heat treatment at a temperature $T_2$ may be used, wherein $T_2$ is advantageously lower than the deposit temperature of the thick strained layer.

Of course, those skilled in the art can easily modify the method presented above so that materials other than $si_{1-x}Ge_x$ or strained Si can be utilized, given that the skilled person knows the properties and physical characteristics of such materials. For example, by retracing the steps previously described with reference to FIGS. 3a to 3e, a skilled person could create a final structure 30 made of AsGa on insulator by choosing a donor wafer 10 whose first layer 1 is made of Ge and the second layer 2 made of AsGa, and by implanting species (as described above) in the Ge material of the first layer 1. Next, the remainder 1' of the Ge and the second layer 2 of AsGa would be transferred to a host wafer 20 by means of an electrically insulating surface, and the remainder 1" of Ge would be selectively removed by using known selective etching techniques.

Similarly, a GaN-on-insulator structure can be manufactured from a donor wafer 10 comprising a first layer 1 made of SiC or Si (111) and a second layer 2 made of GaN. One or several stop layers made of AlGaN and/or AlN may possibly be provided in the GaN layer. After detachment of the second layer 2 made of GaN, a selective etching process including the removal of the GaN located above the stop layer can be used. For example, a dry etching process using a plasma gas of $CH_2$, $H_2$ and possibly Ar, can etch the GaN quicker than AlN. The stop layer could be removed to obtain finally a layer of GaN with little surface roughness and a very homogeneous thickness. In the same manner, the method can be adapted to apply to other transfer layers made of Type III-V or Type II-VI alloys. Furthermore, all of these materials could be extended to those including carbon in small quantities (around 5%) or doping agents.

What is claimed is:

1. A method for forming a semiconductor structure, which comprises:

providing a donor wafer having a first semiconductor layer and a second semiconductor layer on the first layer and having a free surface;

coimplanting two different atomic species through the free surface of the second layer to form a zone of weakness zone in the first layer;

bonding the free surface of the second layer to a host wafer;

supplying energy to detach at the zone of weakness a semiconductor structure comprising the host wafer, the second layer and a portion of the first layer;

strengthening the bond between the second layer and the host wafer by heat treating the detached semiconductor structure at a temperature between 575° C. and 625° C. to provide a bonding energy that is greater than or equal to about 0.8 $J/m^2$;

removing the first layer portion from the structure to expose a surface of the second layer;

wherein the donor wafer comprises a SiGe layer, and the co-implantation of atomic species is conducted according to implantation parameters adapted to enable a first species to form the zone of weakness in the SiGe layer, and to enable a second species to provide a concentration peak located deeper in the first layer and beneath the zone of weakness in the donor wafer to thus minimize surface roughness resulting from detachment of the semiconductor structure at the zone of weakness, wherein the first species is hydrogen and the second species is helium.

2. The method of claim 1, wherein the first species is hydrogen and the second species is helium, with the helium provided at a dose accounting for approximately 30% to 70% of the total does of hydrogen and helium.

3. The method of claim 2, wherein hydrogen is provided at a dose of about $1 \times 10^{16}/cm^2$, and helium is provided at a dose of about $0.9 \times 10^{16}/cm^2$, the hydrogen is implanted at an energy of about 30 keV and the helium is implanteed at an energy of 48 to 60 keV.

4. The method of claim 1, wherein implantation parameters are selected to provide a surface roughness of the second layer immediately after detachment that is less than about 40 Å RMS measured on a 10×10 μm portion of the surface.

5. The method of claim 1, wherein the bond strengthening step comprises conducting plasma activation on the free surface of the second layer, the host wafer or both prior to bonding.

6. The method of claim 1, which further comprises conducting a further heat treatment after the bond strengthening step to further strengthen the bond.

7. The method of claim 6, wherein the further bond strengthening heat treatment is conducted at a temperature of above about 350° C. but less than 800° C. for between about 30 minutes and about 4 hours.

8. The method of claim 1, wherein the supplying energy comprises heating the structure in a furnace to a temperature that causes detachment, and the bond strengthening heat treatment is conducted after detachment occurs and without removing the structure from the furnace.

9. The method of claim 8, wherein the bond strengthening heat treatment comprises a single temperature change from the detachment temperature to a second temperature that is selected for the bond strengthening heat treatment.

10. The method of claim 8, wherein energy supplied to detach the structure from the donor wafer comprises heating the structure at a temperature of about 500° C. for a time of about 30 minutes to about 2 hours.

11. The method of claim 1, wherein the first layer portion is remove from the structure by selectively etching.

12. The method of claim 11, which further comprises, after selectively etching growing a layer of the second material on the second layer to increase its thickness.

13. The method of claim 1, which further comprises, prior to bonding, forming a bonding layer comprising an electrically insulating material on the second layer, the host wafer, or both.

14. The method of claim 13, wherein the electrically insulating material is at least one of $SiO_2$, $Si_3N_4$ or $Si_xO_yN_z$.

15. The method of claim 1, wherein the semiconductor-on-insulator structure obtained after carrying out the method and after removing any contact between the detached layer and the remaining part of the donor wafer, has a surface roughness of less than about 4 Å RMS measured on a surface of 10×10 μm², and a bonding energy greater than or equal to around 0.8 J/m².

16. The method of claim 15, wherein the first layer is made of $Si_{1-x}Ge_x$ with 0<x<1 and the second layer is made of elastically strained Si.

17. The method of claim 15, wherein the donor wafer comprises a support substrate made of bulk Si, a buffer structure made of SiGe, a first layer of $Si_{1-x}Ge_x$ with 0<x<1 and a second layer made of elastically strained Si.

18. The method of claim 15, wherein the first layer is made of elastically strained SiGe and the second layer is made of $Si_{1-x}Ge_x$ with 0<x<1, and the donor wafer comprises a third layer made of $Si_{1-x}Ge_x$ under the first layer.

19. The method of claim 18, wherein the donor wafer comprises a support substrate made of bulk Si, a buffer structure made of SiGe, and a multi-layer structure alternatively comprising first layers made of $Si_{1-x}Ge_x$ (x≠0) and second layers made of strained Si, so as to be able to take off several layer transfers from the same donor wafer.

* * * * *

UNITED STATES PATENT AND TRADEMARK OFFICE
CERTIFICATE OF CORRECTION

PATENT NO. : 7,449,394 B2 Page 1 of 1
APPLICATION NO. : 11/179713
DATED : November 11, 2008
INVENTOR(S) : Akatsu et al.

It is certified that error appears in the above-identified patent and that said Letters Patent is hereby corrected as shown below:

Column 17
Line 10 (claim 2, line 4), change "does" to -- dose --.
Line 14 (claim 3, line 4), change "implanteed" to -- implanted --.

Column 18
Line 6 (claim 11, line 2), change "remove" to -- removed --.
Line 20 (claim 15, line 5), change "4" to -- 40 --.

Signed and Sealed this

Twentieth Day of January, 2009

JON W. DUDAS
*Director of the United States Patent and Trademark Office*